(12) United States Patent
Hayama

(10) Patent No.: US 11,764,818 B2
(45) Date of Patent: Sep. 19, 2023

(54) FILTER CIRCUIT, SIGNAL PROCESSING METHOD, CONTROL CIRCUIT, AND PROGRAM STORAGE MEDIUM

(71) Applicant: Mitsubishi Electric Corporation, Tokyo (JP)

(72) Inventor: Michiya Hayama, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 17/721,040

(22) Filed: Apr. 14, 2022

(65) Prior Publication Data
US 2022/0239321 A1 Jul. 28, 2022

Related U.S. Application Data

(63) Continuation of application No. PCT/JP2019/048315, filed on Dec. 10, 2019.

(51) Int. Cl.
*H04B 1/18* (2006.01)
*H04B 1/3805* (2015.01)

(52) U.S. Cl.
CPC ............ *H04B 1/18* (2013.01); *H04B 1/3805* (2013.01); *H04B 2001/3811* (2013.01)

(58) Field of Classification Search
CPC .......... H03H 17/02; H03M 1/66; H03M 3/02; H04B 1/18; H04B 1/3805; H04B 2001/3811
See application file for complete search history.

(56) References Cited

U.S. PATENT DOCUMENTS 5,682,162 A 10/1997 Hamasaki et al.
7,310,306 B1 * 12/2007 Cheriton ................. H04L 49/30
                                                370/220

(Continued)

FOREIGN PATENT DOCUMENTS

| JP | 8-186497 A | 7/1996 |
|---|---|---|
| JP | 2002-64384 A | 2/2002 |
| JP | 2005-6273 A | 1/2005 |

OTHER PUBLICATIONS

Cordeiro et al., "Gigasample Time-Interleaved Delta-Sigma Modulator for FPGA-based All-Digital Transmitters", Proc. of the 2014 17th Euromicro Conference on Digital System Design, Aug. 2014, pp. 222-227.

(Continued)

*Primary Examiner* — Nguyen T Vo
(74) *Attorney, Agent, or Firm* — Birch, Stewart, Kolasch & Birch, LLP

(57) ABSTRACT

A filter circuit includes: a division unit that divides an input signal and adds, to a tail end of a division block, of head data of the next division block, to generate an input block; a plurality of signal processing units that perform filtering of a feedback type on input blocks to generate output samples, and generate and output blocks; and a coupling unit that couples the output blocks. The signal processing unit outputs first output samples generated until a switching timing, and outputs second output samples generated by the signal processing unit after the timing. The switching timing is a timing within a period corresponding to the duplicated data, at which timing a difference between a first signal generated by the signal processing unit and a second signal generated by the signal processing unit is less than or equal to a threshold consecutively for a second data length.

10 Claims, 12 Drawing Sheets

(56) References Cited

U.S. PATENT DOCUMENTS

2004/0252038 A1 12/2004 Robinson et al.
2017/0077945 A1* 3/2017 Pagnanelli .......... H03F 3/45475

OTHER PUBLICATIONS

Cordeiro et al., "Wideband All-digital Transmitter Based on Multicore DSM", Proc. of the 2016 IEEE MTT-S International Microwave Symposium, May 2016, total 4 pages.

Dinis et al., "A Fully Parallel Architecture for Designing Frequency-Agile and Real-Time Reconfigurable FPGA-Based RF Digital Transmitters", IEEE Transactions On Microwave Theory and Techniques, Mar. 2018, vol. 66, No. 3, pp. 1489-1499.

International Search Report for PCT/JP2019/048315 dated Feb. 25, 2020.

Tanio et al., "An FPGA-based 1-bit Digital Transmitter with 800-MHz Bandwidth for 5G Millimeter-wave Active Antenna Systems", Proc. of the 2018 IEEE/MTT-S International Microwave Symposium, Jun. 2018, pp. 499-502.

Tanio et al., "An FPGA-based All-Digital Transmitter with 28-GHz Time-Interleaved Delta-Sigma Modulation", Proc. of the 2016 IEEE MTT-S International Microwave Symposium, May 2016, total 4 pages.

Tanio et al., "An FPGA-based All-Digital Transmitter with 9.6-GHz 2nd order Time-Interleaved Delta-Sigma Modulation for 500-MHz bandwidth", Proc. of the 2017 IEEE MTT-S International Microwave Symposium, Jun. 2017, pp. 149-152.

Wang et al., "Delta-Sigma Modulation for Next Generation Fronthaul Interface", Journal of Lightwave Technology, 2018, vol. 37, No. 12, total 25 pages.

Written Opinion of the International Searching Authority for PCT/JP2019/048315 dated Feb. 25, 2020.

* cited by examiner

FILTER CIRCUIT, SIGNAL PROCESSING METHOD, CONTROL CIRCUIT, AND PROGRAM STORAGE MEDIUM

CROSS-REFERENCE TO RELATED APPLICATION

This application is a continuation application of International Application PCT/JP2019/048315, filed on Dec. 10, 2019, and designating the U.S., the entire contents of which are incorporated herein by reference.

BACKGROUND OF THE INVENTION

1. Field of the Invention

The disclosure relates to a filter circuit, a signal processing method, a control circuit, and a program storage medium for dividing an input signal to perform parallel filtering.

2. Description of the Related Art

Feedback filters used for digital signal processing can achieve desired properties with a smaller number of taps than non-feedback filters. Unfortunately, feedback filters, which include feedback paths, must process input signals sequentially on a sample-by-sample basis, and are thus difficult to parallelize. In general, methods for parallelizing such feedback filters are roughly divided into two types: use of polyphase decomposition and time division of input signals.

The former type of method achieves parallelization through polyphase decomposition of the feedback filter part. Because the signal processing itself is equivalent to that before parallelization, this type of method has the advantage that signal deterioration due to parallelization does not occur. Unfortunately, there is a signal dependency between a plurality of feedback filters that process polyphase-decomposed signals, which imposes restrictions on the feasible order and filter properties.

The latter type of method achieves parallelization by dividing an input signal into blocks of hundreds to thousands of samples by time domain, for example, and processing these blocks with a plurality of feedback filters. This type of method, in which there is no signal dependency between parallelized feedback filters, allows the order and filter properties to be determined flexibly compared with the method of using polyphase decomposition described above. For example, Japanese Patent Application Laid-open No. 2005-6273 discloses a signal conversion system that achieves parallelization by providing a plurality of delta-sigma modulators that use an infinite impulse response (IIR) filter, an example of a feedback filter, dividing an input signal by time domain, and processing the divisions of the signal in the different delta-sigma modulators.

Unfortunately, with the method of dividing an input signal by time domain, the filtered signal has a discontinuity at the boundary between division blocks, which lowers the signal-to-noise ratio of the filtered signal.

SUMMARY OF THE INVENTION

To solve the above problem, a filter circuit according to the disclosure comprises: a division unit to: divide an input signal into division blocks having data lengths defined by time domain, the division blocks including a first division block and a second division block next to and temporally continuous with the first division block; and duplicate head data of the second division block and add duplicated data to a tail end of the first division block to thereby generate an input block, the duplicated data being the duplicated head data, the head data being data of a head of the second division block and having a first data length; a plurality of signal processing units to each perform filtering of a feedback type on a corresponding one of a plurality of the input blocks on a sample-by-sample basis to generate output samples as a result of the filtering, and generate and output an output block, using the output samples; and a coupling unit to couple the output blocks output from the plurality of signal processing units, wherein in response to each input block, at least one of the plurality of signal processing units outputs first output samples as the output block until a switching timing, the first output samples being the output samples generated by the at least one of the plurality of signal processing units, and outputs a part of second output samples as the output block after the switching timing, the second output samples being the output samples generated by the signal processing unit that processes the next input block, the output part of the second output samples corresponding to a part that follows the first output samples already output as the output block, and the switching timing is a timing within a period during which the first output samples corresponding to the duplicated data are generated, at which timing a difference between a first signal generated by the signal processing unit that has generated the first output samples and a second signal generated by the signal processing unit that has generated the second output samples is less than or equal to a threshold consecutively for a second data length.

DETAILED DESCRIPTION OF THE PREFERRED EMBODIMENTS

A filter circuit, a signal processing method, a control circuit, and a program storage medium according to embodiments of the disclosure will be hereinafter described in detail with reference to the drawings.

First Embodiment

Figure 1:
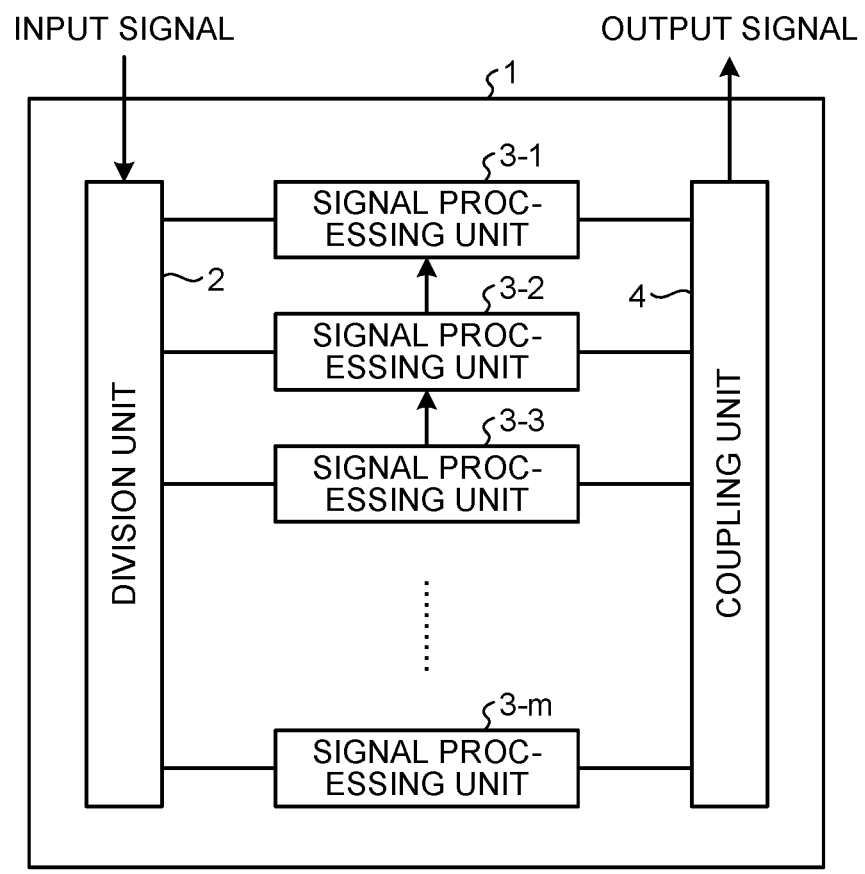
FIG. 1 is a diagram illustrating an exemplary configuration of a filter circuit according to a first embodiment.

FIG. 1 is a diagram illustrating an exemplary configuration of a filter circuit according to the first embodiment. As illustrated in FIG. 1, the filter circuit 1 according to the present embodiment includes a division unit 2, signal processing units 3-1 to 3-m, and a coupling unit 4. Reference character m is an integer of two or more. The filter circuit according to the disclosure will be described below as, by way of example, the delta-sigma digital-to-analog converter (DAC) circuit illustrated in FIG. 1.

The division unit 2 divides an input signal into division blocks having data lengths defined by time domain. The division blocks include a first division block and a second division block next to and temporally continuous with the first division block. The division unit 2 further duplicates head data of the second division block and adds duplicated data to the tail end of the first division block to thereby generate an input block. The duplicated data is the duplicated head data. The head data is data of the head of the second division block and has a first data length. Note that a signal corresponding to one sample time is called one sample. The data length will be hereinafter represented by the number of samples, and the data length of a division block in the present embodiment will be referred to as $N_{blk}$ samples. In the case of representing the data length in terms of the number of samples, hereinafter, the unit "samples" may be omitted. For example, the block length of $N_{blk}$ samples is abbreviated as block length $N_{blk}$.

Specifically, the division unit 2 divides an input signal of $N_{input}$ samples into m blocks, each of which is a signal of $N_{blk}$ samples. $N_{input}$ corresponds to the length of the input signal to be handled in one process in the filter circuit 1. Because $N_{input}$ samples are divided into m division blocks, $N_{input}=N_{blk} \times m$ holds. Note that separate input signals of $N_{input}$ samples each may be input to, or a continuous input signal may be input to the filter circuit 1 without being separated. In the case where a continuous input signal is input to the filter circuit 1 without being separated, the input signal may be similarly divided into m division blocks every $N_{input}$ samples. On the basis of the m division blocks obtained by dividing the input signal, the division unit 2 generates m input blocks each to be input to the corresponding one of the signal processing units 3-1 to 3-m.

Figure 2:
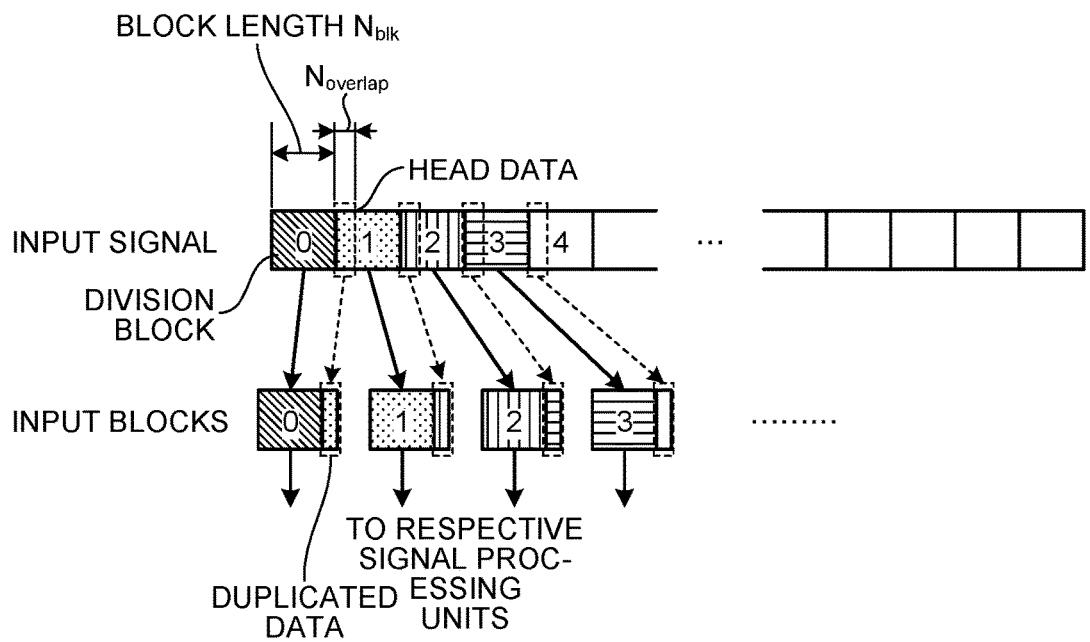
FIG. 2 is a diagram for explaining input blocks according to the first embodiment.

FIG. 2 is a diagram for explaining input blocks according to the present embodiment. As illustrated in FIG. 2, a division block, which is obtained by the division of the input signal, has the block length $N_{blk}$, and the division unit 2 duplicates the head data of the next division block, which is $N_{overlap}$ samples from the head of the next division block, and adds the duplicated head data to the tail end of the division block of the block length $N_{blk}$. As a result, a division block has a tail end portion identical to the head data of the next division block. That is, the duplicated data at the tail end portion of a division block and the head data of the next division block overlap. The duplicated data at the tail end portion of a division block and the head data of the next division block are called an overlap section.

In FIG. 2, the indications 0, 1, etc. in the rectangles representing different division blocks mean block numbers (block #). For example, the division unit 2 generates the input block of block #0 by duplicating the head data of the division block of block #1 and adding the duplicated data to the tail end of the division block of block #0. Similarly, the division unit 2 generates the input block of block #1 by duplicating the head data of the division block of block #2 and adding the duplicated data to the tail end of the division block of block #1. In this way, the division unit 2 generates m input blocks by adding, to the tail end of each division block, duplicated data of the head data of the next division block, and inputs each of the m input blocks to the corresponding one of the signal processing units 3-1 to 3-m. Note that block #0 is input to the signal processing unit 3-1 and block #1 is input to the signal processing unit 3-2: the input block of block #k is input to the signal processing unit 3-(k+1), where k is an integer of zero to (m−1).

The signal processing units 3-1 to 3-m each generate an output block by performing feedback filtering on the input block input from the division unit 2, and output the output block to the coupling unit 4. That is, the signal processing units 3-1 to 3-m, which are a plurality of signal processing units, each perform filtering of a feedback type on the corresponding one of a plurality of input blocks on a sample-by-sample basis to generate output samples as a result of the filtering. Using the output samples, the signal processing units 3-1 to 3-m each generate and output an output block. At least one of the signal processing units 3-1 to 3-m further performs timing adjustment to alleviate the discontinuity between blocks. As will be described later, each output block has a block length of $N_{blk}$. The details of the processing in the signal processing units 3-1 to 3-m will be described later.

Figure 3:
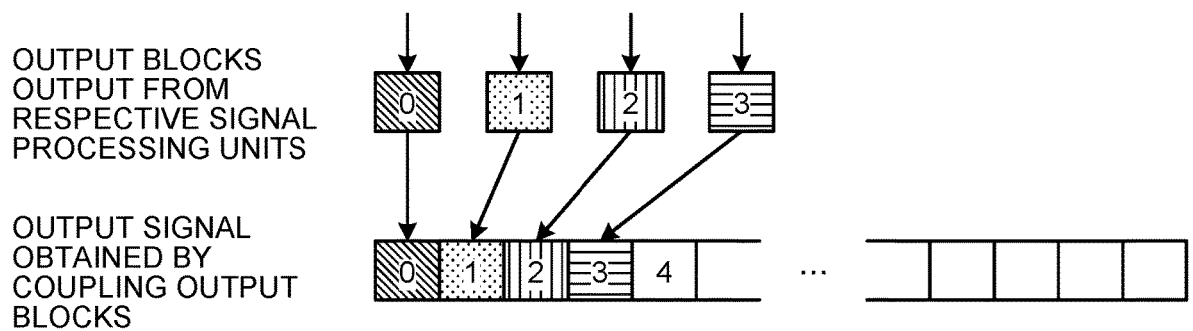
FIG. 3 is a diagram for explaining a process of coupling output blocks according to the first embodiment.

The coupling unit 4 couples the output blocks output from the signal processing units 3-1 to 3-m, and output the coupled output blocks as an output signal. FIG. 3 is a diagram for explaining a process of coupling output blocks according to the present embodiment. As illustrated in FIG. 3, the coupling unit 4 generates an output signal by coupling the output blocks output from the signal processing units 3-1 to 3-m such that the coupled output blocks are arranged in order of block number.

As described above, the filter circuit 1 according to the present embodiment performs feedback filtering, that is, filtering that uses past samples, on an input signal of $N_{input}$ samples, and outputs the processed signal as an output signal. Assume that the input signal is divided by the time domain and subjected to the feedback filtering. Performing feedback filtering on each division block resulting from simple division of the input signal causes a signal discontinuity between the blocks. In the case of filtering the head sample of the block of block #2, for example, the previous sample is not used in the processing on the head sample of the block of block #2. This is because such a previous sample is processed as another block. For this reason, the result of processing on this head sample is different from that which would be obtained when the input signal is not divided. As a result, a signal discontinues between the blocks. A possible way to avoid this problem is to provide an overlap section between adjacent blocks, and after filtering, delete the processing result corresponding to the overlap section from the latter of the two blocks. This method, however, can still cause a discontinuity between blocks: for example, if filtering includes non-linear processing, the processed tail end portion of the previous block and the processed head of the next block do not necessarily have the same processing result. In view of this, in the present embodiment, the signal processing unit 3-($k$–1) that processes the input block of block #k–2 uses a result of comparison between the output samples of the signal processing unit 3-$k$ and the samples filtered in the signal processing unit 3-($k$–1) to control the switching timing at which to switch between the filtered samples corresponding to the overlap section. The term "switching" herein means that the signal processing unit 3-($k$–1) switches the samples to be output in the overlap section from the samples filtered in the signal processing unit 3-($k$–1) to the output samples of the signal processing unit 3-$k$.

Figure 4:
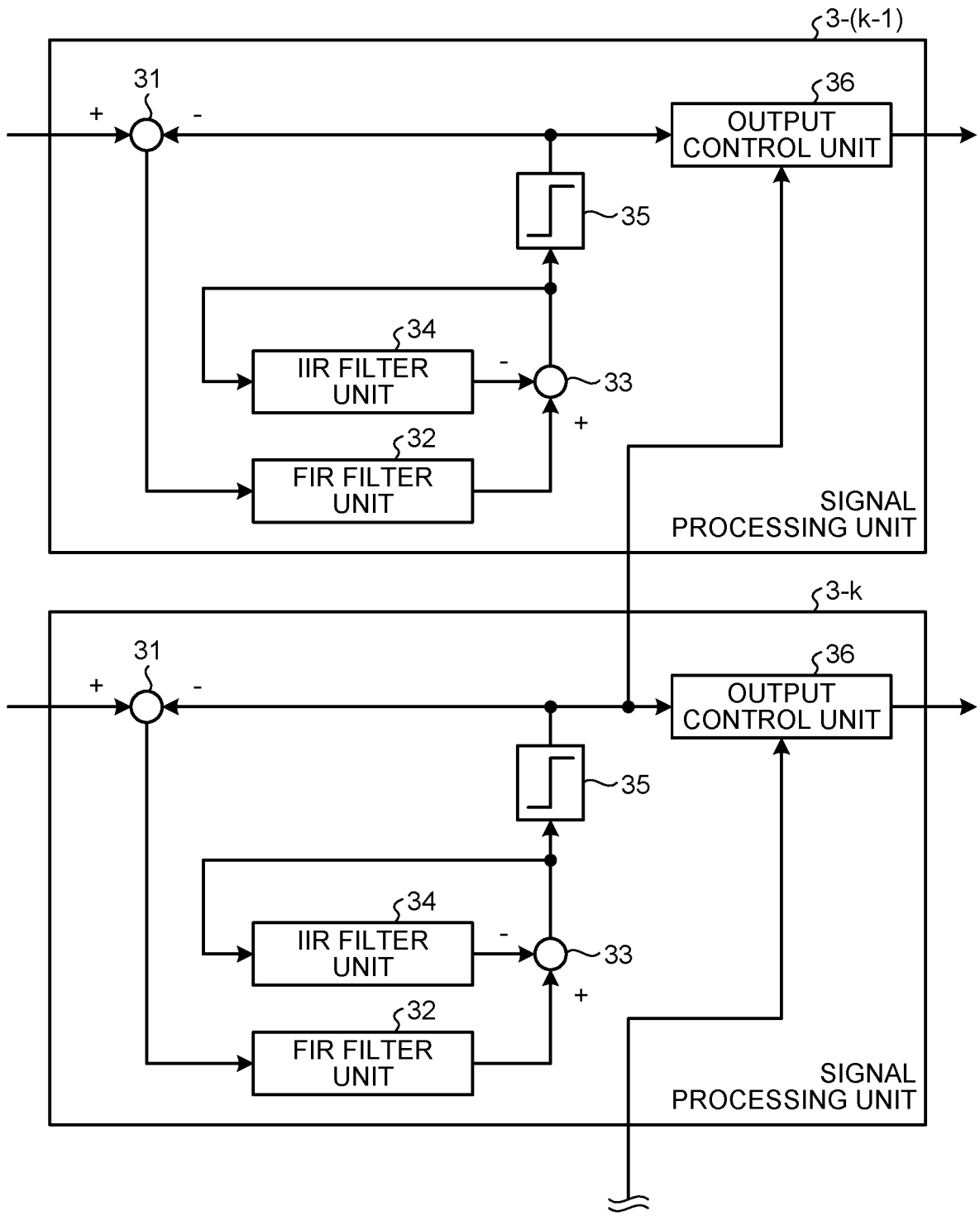
FIG. 4 is a diagram illustrating an exemplary configuration of a signal processing unit according to the first embodiment.

Next, the details of the signal processing units 3-1 to 3-$m$ according to the present embodiment will be described. The signal processing units 3-1 to 3-$m$ have substantially the same configuration except that the signal processing units 3-1 and 3-$m$ are partially different from the signal processing units 3-2 to 3-($m$–1) in terms of signal output and the like. FIG. 4 is a diagram illustrating an exemplary configuration of the signal processing unit 3-($k$–1) and the signal processing unit 3-$k$ according to the present embodiment. As illustrated in FIG. 4, the signal processing unit 3-($k$–1) includes a subtraction unit 31, a finite impulse response (FIR) filter unit 32, a subtraction unit 33, an IIR filter unit 34, a non-linear processing unit 35, and an output control unit 36. The configuration of the signal processing unit 3-$k$ is the same as that of the signal processing unit 3-($k$–1).

The subtraction unit 31 subtracts a result of processing by the non-linear processing unit 35 from each sample of the input block of block #k–2 input to the signal processing unit 3-($k$–1), and inputs the subtraction result to the FIR filter unit 32. The FIR filter unit 32 performs convolution, i.e. a process of outputting the inner product of a signal of L samples and a predetermined coefficient value, where the L samples are the input sample and preceding (L–1) samples. Reference character L is an integer of two or more. The FIR filter unit 32 inputs the processed signal to the subtraction unit 33. The subtraction unit 33 subtracts a signal input from the IIR filter unit 34 from the signal input from the FIR filter unit 32. The subtraction result in the subtraction unit 33 is input to the non-linear processing unit 35 and the IIR filter unit 34. The IIR filter unit 34 performs convolution, i.e. a process of outputting the inner product of a signal of L samples and a predetermined coefficient value, where the L samples are the input signal and preceding (L–1) samples, and inputs the processing result to the subtraction unit 33.

The non-linear processing unit 35 performs non-linear processing on the input signal. Thus, the filtering according to the present embodiment includes non-linear processing. The non-linear processing that the non-linear processing unit 35 performs is, for example, quantization for outputting a discrete value by comparing a predetermined determination threshold with an input signal. The processing result in the non-linear processing unit 35 is input as output samples to the output control unit 36 and the subtraction unit 31. The samples output from the non-linear processing unit 35 of the signal processing unit 3-($k$–1) are individual samples of the input block of block #k–2 that have been subjected to feedback filtering, and therefore the samples output from the non-linear processing unit 35 are also referred to as output samples of block #k–2.

Further, the output control unit 36 receives the output samples output from the non-linear processing unit 35 of the signal processing unit 3-$k$. The output control unit 36 provides output samples, switching between the output samples of the signal processing unit 3-($k$–1) and the output samples of the signal processing unit 3-$k$ for output. The output samples of one block that the output control unit 36 outputs in correspondence to one input block are called an output block. Note that the exemplary configuration illustrated in FIG. 4 is merely an example, and other components illustrated in FIG. 4 than the output control unit 36 may have any configuration that forms a feedback filtering circuit. FIG. 4 does not depict a route for inputting the output samples of the signal processing unit 3-($k$–1) to the signal processing unit 3-($k$–2), but in the case where k is three or more, the output samples of the signal processing unit 3-($k$–1) are input to the output control unit 36 of the signal processing unit 3-($k$–2) in the same way as the output samples output from the non-linear processing unit 35 of the signal processing unit 3-$k$ are input to the output control unit 36 of the signal processing unit 3-($k$–1). FIG. 4 illustrates the case where k is m–1 or less, and thus depicts the route of input from the non-linear processing unit 35 of the signal processing unit 3-($k$+1) to the output control unit 36 of the signal processing unit 3-$k$.

Figure 5:
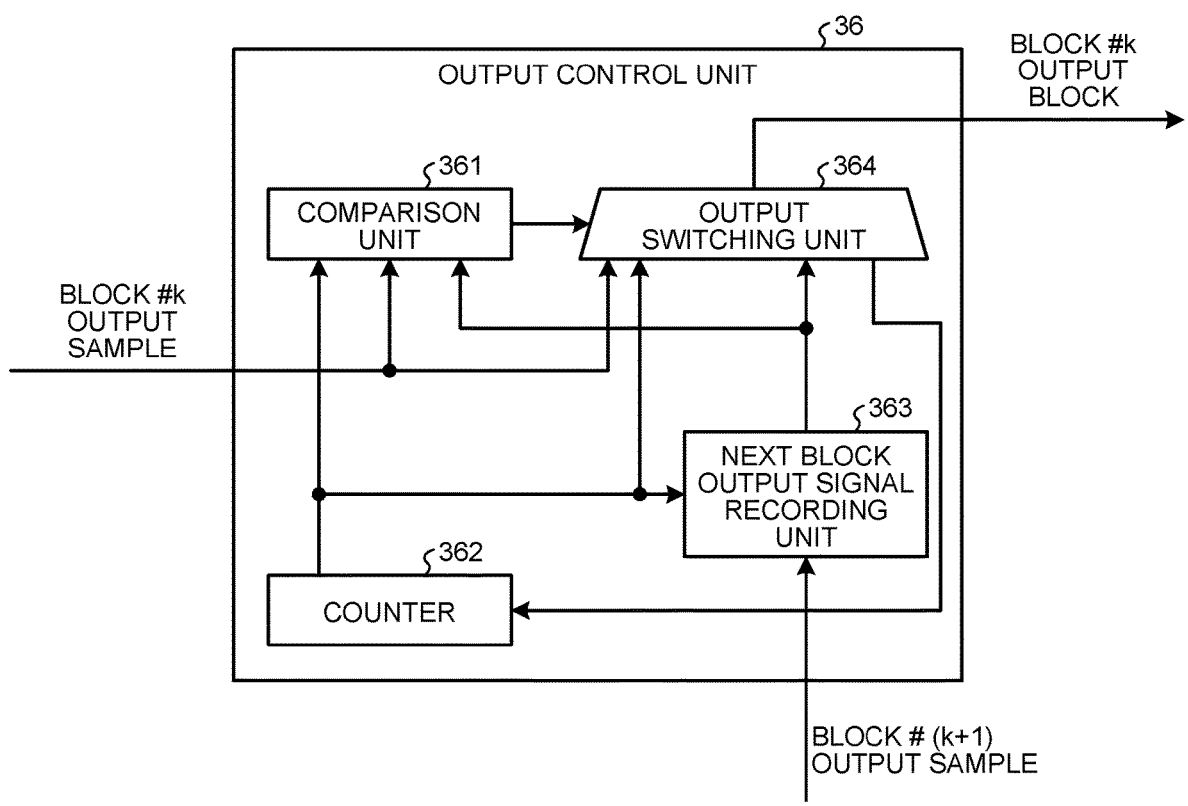
FIG. 5 is a diagram illustrating an exemplary configuration of an output control unit according to the first embodiment.

FIG. 5 is a diagram illustrating an exemplary configuration of the output control unit 36 according to the present embodiment. As illustrated in FIG. 5, the output control unit 36 includes a comparison unit 361, a counter 362, a next block output signal recording unit 363, and an output switching unit 364. The operation of the output control unit 36 will be described on the assumption that the output control unit 36 is an output control unit of the signal processing unit 3-($k$–1). The counter 362 counts the number of samples the signal processing unit 3-($k$–1) has processed block-by-block, that is, the number of samples input from the non-linear processing unit 35, starting from the head of the input block, and outputs the counter value indicating the counted number of samples to the comparison unit 361, the next block output signal recording unit 363, and the output switching unit 364. The initial value of the counter value of the counter 362 is zero, and the counter value increases by one every time the output control unit 36 outputs one sample. In addition, the counter value of the counter 362 is reset to zero every time one block is processed.

The next block output signal recording unit 363 records the output samples corresponding to the head data among the output samples output from the signal processing unit 3-$k$. That is, among the output block of block #($k$–1) output from the signal processing unit 3-$k$, $N_{overlap}$ samples from the head are recorded. On the basis of the counter value input from the counter 362, the next block output signal recording unit 363 outputs, to the comparison unit 361 and the output switching unit 364, the recorded output sample of block #($k$–1) corresponding to the latest output sample. For example, when the output sample corresponding to the head of the overlap section of block #($k$–2) is input to the output control unit 36, that is, when the counter value is $N_{blk}$, the next block output signal recording unit 363 outputs the output sample at the head of the overlap section of block #($k$–1), that is, the output sample of sample #0, to the comparison unit 361 and the output switching unit 364. Similarly, when the counter value is ($N_{blk}$+1), the next block output signal recording unit 363 outputs the output sample next to the head of the overlap section of block #(k−1), that is, the output sample of sample #1, to the comparison unit 361 and the output switching unit 364.

The comparison unit 361 compares the output sample of block #(k−2) input from the non-linear processing unit 35 with the output sample of the overlap section of the next block, that is, block #(k−1), output from the next block output signal recording unit 363, and outputs the comparison result to the output switching unit 364. The comparison result indicates whether the compared two output samples match each other. Note that the comparison unit 361 may determine that the compared two output samples match each other when the absolute value of the difference between the two output samples is less than or equal to a threshold. The threshold is determined by the ratio to the full scale such as 10% of the full scale of the output value, but the method of determining the threshold is not limited to this example. This threshold is set to a value that causes no discontinuity issues. The output switching unit 364 determines, on the basis of the counter value input from the counter 362, whether to turn on or off output from the output switching unit 364, that is, whether to output an output sample from the output control unit 36. Further, when output from the output control unit 36 is in an on state, the output switching unit 364 determines, on the basis of the comparison result output from the comparison unit 361, whether to output the output sample of block #(k−2) input from the non-linear processing unit 35 or the output sample output from the next block output signal recording unit 363.

Figure 6:
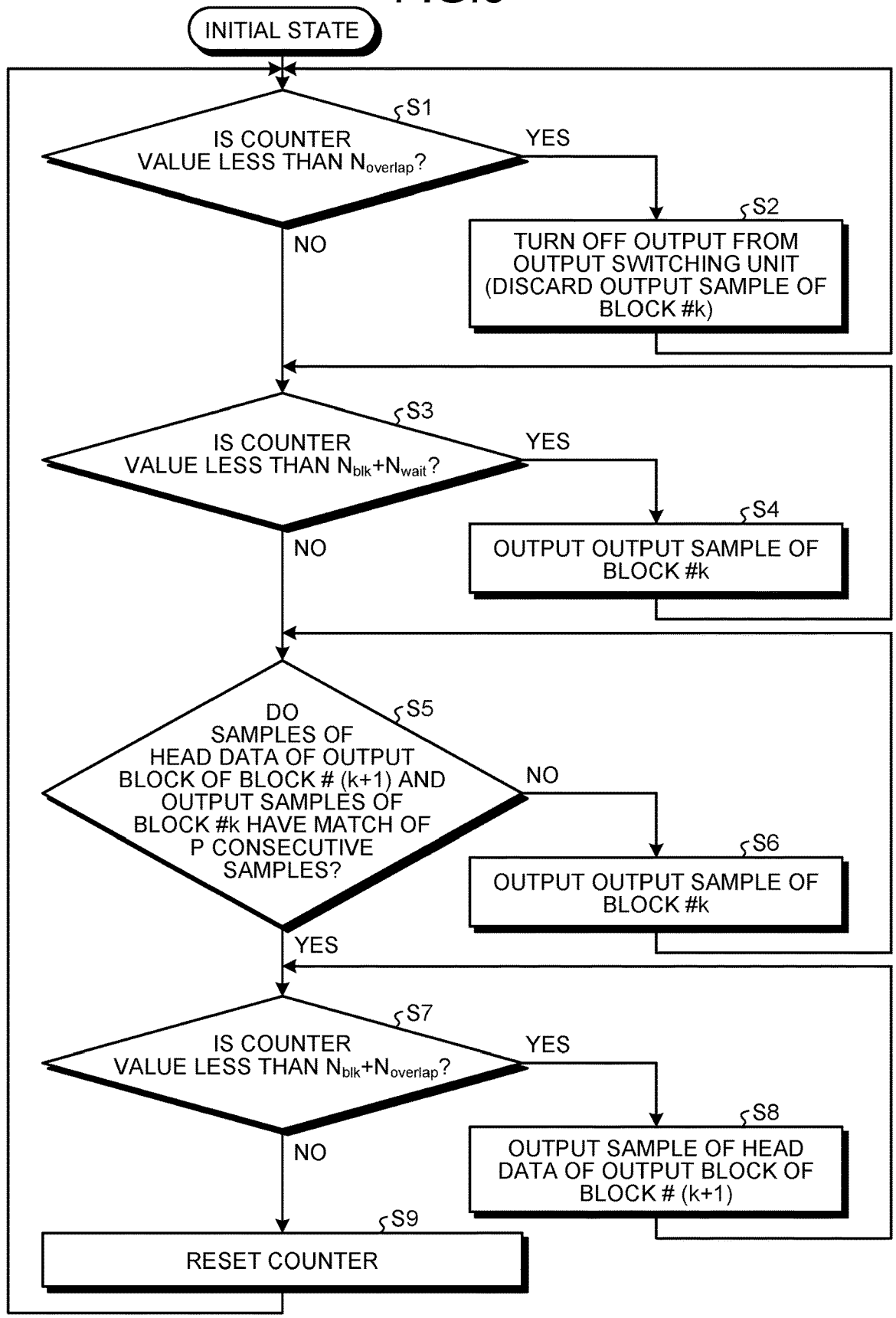
FIG. 6 is a flowchart illustrating an example of output switching processing in an output switching unit according to the first embodiment.

FIG. 6 is a flowchart illustrating an example of output switching processing in the output switching unit 364 according to the present embodiment. As illustrated in FIG. 6, the output switching unit 364 determines whether the counter value is less than $N_{overlap}$ (step S1). When determining that the counter value is less than $N_{overlap}$ (step S1: Yes), the output switching unit 364 turns off output from the output control unit 36 (step S2). In the meantime, the output sample of block #k is input to the output switching unit 364, but the output switching unit 364 discards the output sample of block #k. After step S2, the output switching unit 364 performs step S1 again.

When determining that the counter value is greater than or equal to $N_{overlap}$ (step S1: No), the output switching unit 364 determines whether the counter value is less than $N_{blk}+N_{wait}$ (step S3). $N_{wait}$ is a value which is set to deal with the fact that filtering in the vicinity of the head of each block produces unstable output samples. $N_{wait}$ will be described later. When determining that the counter value is less than $N_{blk}+N_{wait}$ (step S3: Yes), the output switching unit 364 outputs the output sample of block #k (step S4). Note that step S4, which performs output from the output switching unit 364, corresponds to turning on output from the output switching unit 364. After step S4, the output switching unit 364 performs step S3 again.

When determining that the counter value is greater than or equal to $N_{blk}+N_{wait}$ (step S3: No), the output switching unit 364 determines whether the samples of the head data of the output block of block #(k+1) and the output samples of block #k have a match of P consecutive samples (step S5). Specifically, the output switching unit 364 determines whether comparison results received from the comparison unit 361 indicate that the samples of the head data of the output block of block #(k+1) and the output samples of block #k have a match of P consecutive samples, i.e. a second data length. Note that the output switching unit 364 can retain the comparison results of at least (P−1) samples received from the comparison unit 361 so as to determine whether the comparison results indicate that the two different types of output samples have a match of P consecutive samples. Alternatively, the comparison unit 361 may retain the comparison results of at least (P−1) samples, and notify the output switching unit 364 when the comparison results indicate that the two different types of output samples have a match of P consecutive samples. Still alternatively, the comparison unit 361 may count the number of consecutive matches confirmed, and once the number of consecutive matches reaches P, notify the output switching unit 364 that the match of P consecutive samples has been confirmed. Upon receiving this notification, the output switching unit 364 selects Yes in step S5. For example, the comparison unit 361 may have a counter so as to count the number of consecutive matches by incrementing the count value of the counter by one each time a match is confirmed, and resetting the count value of the counter to zero once a non-match is confirmed. Alternatively, the comparison unit 361 may retain (P−1) output samples of block #k, use the output samples of block #(k+1) recorded in the next block output signal recording unit 363 for collective comparison of P samples, and notify the output switching unit 364 of the comparison result of the P samples.

When determining that the comparison result between the samples of the head data of the output block of block #(k+1) and the output samples of block #k indicates that P consecutive samples have at least one non-match (step S5: No), the output switching unit 364 outputs the output sample of block #k (step S6). After step S6, the output switching unit 364 performs step S5 again.

When determining that the samples of the head data of the output block of block #(k+1) and the output samples of block #k have a match of P consecutive samples (step S5: Yes), the output switching unit 364 determines whether the counter value is less than $N_{blk}+N_{overlap}$ (step S7). When determining that the counter value is less than $N_{blk}+N_{overlap}$ (step S7: Yes), the output switching unit 364 outputs the sample of the head data of the output block of block #(k+1) (step S8). After step S8, the output switching unit 364 performs step S7 again.

When determining that the counter value is greater than or equal to $N_{blk}+N_{overlap}$ (step S7: No), the output switching unit 364 resets the counter 362 (step S9) and returns to step S1. The output switching unit 364 performs the above operation every time the counter value is updated.

In this way, at least one of a plurality of signal processing units, namely the signal processing units 3-1 to 3-m, outputs first output samples as an output block in response to each input block until a switching timing. A specific example of the at least one of the signal processing units 3-1 to 3-m is the signal processing units 3-1 to 3-(m−1). The first output samples are the output samples generated by the at least one of the signal processing units 3-1 to 3-m. Then, after the switching timing, at least one of the signal processing units 3-1 to 3-m outputs a part of second output samples as the output block. The second output samples are the output samples generated by the signal processing unit that processes the next input block, and the output part of the second output samples corresponds to a part that follows the first output samples already output as the output block. The switching timing is a timing within a period during which first output samples corresponding to the duplicated data is generated, that is, a period corresponding to the overlap section. At this switching timing, the difference between a first signal generated by the signal processing unit that has generated first output samples and a second signal generated by the signal processing unit that has generated second output samples is less than or equal to a threshold consecutively for the second data length. In the present embodiment, the first signal is first output samples and the second signal is second output samples. Note that the signal processing unit 3-$m$, which processes block #($m$−1), does not have a signal processing unit that processes a block that would be next to block #($m$−1); therefore, the signal processing unit 3-$m$ does not perform the switching-timing-based process described above, and outputs first output samples until the end of the output block.

In addition, when at least one of the signal processing units 3-1 to 3-$m$ processes an input block, which is first input block, and discards first output samples corresponding to the head data of the first input block, provided that there exists a signal processing unit that processes a second input block that is an input block having duplicated data added thereto, the duplicated data being the duplicated head data of the first input block. The signal processing unit 3-1 processes the input block defining the head of the input signal of $N_{input}$ samples. Provided that the signal processing unit 3-1 processes the first input block, there does not exist a signal processing unit that, in parallel to the processing on that first input block, processes the second input block that is the input block including the duplicated data that is the duplicate of the head data of the first input block. In this case, the signal processing unit 3-1 still discards first output samples corresponding to the head data of the first input block because output samples corresponding to the head data of the first input block have already been output as a part of an output block at the tail end of the input signal in the previous parallel process. In the case of processing an initial input signal, the signal processing unit 3-1 need not discard the above first output samples. The signal processing units 3-2 to 3-$m$ discard the above first output samples.

Figure 7:
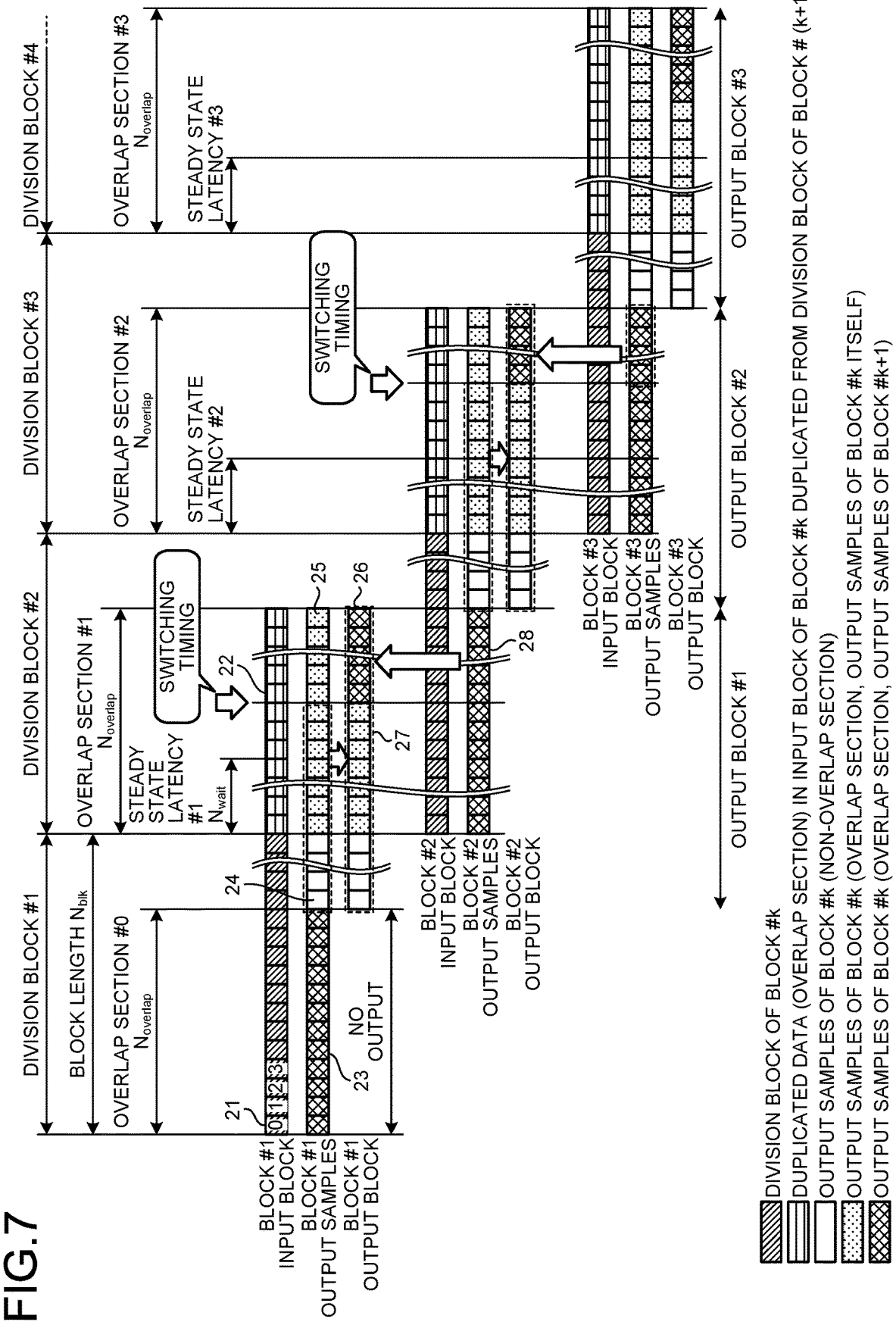
FIG. 7 is a diagram schematically illustrating the relationship between division blocks, input blocks, and output blocks according to the first embodiment.

Next, the switching of output samples in an overlap section in the filter circuit 1 according to the present embodiment will be described with reference to a diagram illustrating data. FIG. 7 is a diagram schematically illustrating the relationship between division blocks, input blocks, and output blocks according to the present embodiment. As illustrated in FIG. 7, duplicated data 22, which is a duplicate of the $N_{overlap}$ samples at the head of division block #2 in overlap section #1, is added to a division block #1, i.e., a division block 21 of block #1 to thereby provide an input block of block #1. Each sample of the input block of block #1 is filtered in the signal processing unit 3-2, and the processed samples are output as output samples from the non-linear processing unit 35. Among the output samples of block #1, samples 23 in the section denoted by overlap section #0 are output samples corresponding to the section duplicated and added to block #0. In the present embodiment, the output samples corresponding to the head data portion of each division block are output through the processing of the input block corresponding to the previous division block; therefore, among the output samples of block #1, the output samples in overlap section #0 are not output from the output control unit 36 of the signal processing unit 3-2.

Among the output samples of block #1, output samples 24 (unhatched portion in FIG. 7) interposed between the sections denoted by overlap section #0 and overlap section #1 are output from the output control unit 36 of the signal processing unit 3-2. Among the output samples 25 output in overlap section #1 from the non-linear processing unit 35 of the signal processing unit 3-2, the $N_{wait}$ output samples at the head of overlap section #1 are output from the output control unit 36 regardless of the comparison result in the comparison unit 361. $N_{wait}$ is the number of samples corresponding to steady state latency #1, that is, time to wait for switching the samples to be output from the output control unit 36 to the output samples of the next block. Filtering in the vicinity of the head of each block produces unstable output samples. In view of this, regardless of the comparison result in the comparison unit 361, the output control unit 36 of the signal processing unit 3-2 outputs $N_{wait}$ samples at the head of overlap section #1 that are output samples output from the non-linear processing unit 35 of the signal processing unit 3-2. That is, $N_{wait}$ samples output from the output control unit 36 are output samples obtained by processing the input block of block #1.

As described above, output samples 28 of the head data of block #2 are generated by processing the input block of block #2 in the signal processing unit 3-3, and input from the signal processing unit 3-3 to the signal processing unit 3-2. Among output samples 25 output in overlap section #1 from the non-linear processing unit 35 of the signal processing unit 3-2, the ($N_{wait}$+1)-th and subsequent output samples 25 from the head are output from the output control unit 36 of the signal processing unit 3-2 unless these output samples 25 and the corresponding output samples 28 of the head data of block #2 have a match of P consecutive samples. On the other hand, once the ($N_{wait}$+1)-th and subsequent output samples 25 from the head and the corresponding output samples 28 of the head data of block #2 have a match of P consecutive samples, the output control unit 36 of the signal processing unit 3-2 outputs these output samples 28 of the head data of block #2 as output samples 26. In this way, the ($N_{wait}$+1)-th and subsequent output samples from the head of overlap section #1 are switched from the output samples 25 to the output samples 28 and the output samples 28 are output from the output control unit 36 of the signal processing unit 3-2 once the output samples 25 and the corresponding output samples 28 of the head data of block #2 have a match of P consecutive samples. In FIG. 7, the position where this switching is performed is denoted by "switching timing".

Accordingly, output samples 27 filtered by the signal processing unit 3-2 and output samples 26 which are the output samples 28 filtered by the signal processing unit 3-3 are output as the output block of block #1 from the signal processing unit 3-2. This exemplary process based on block #1 also applies to other blocks.

Figure 8:
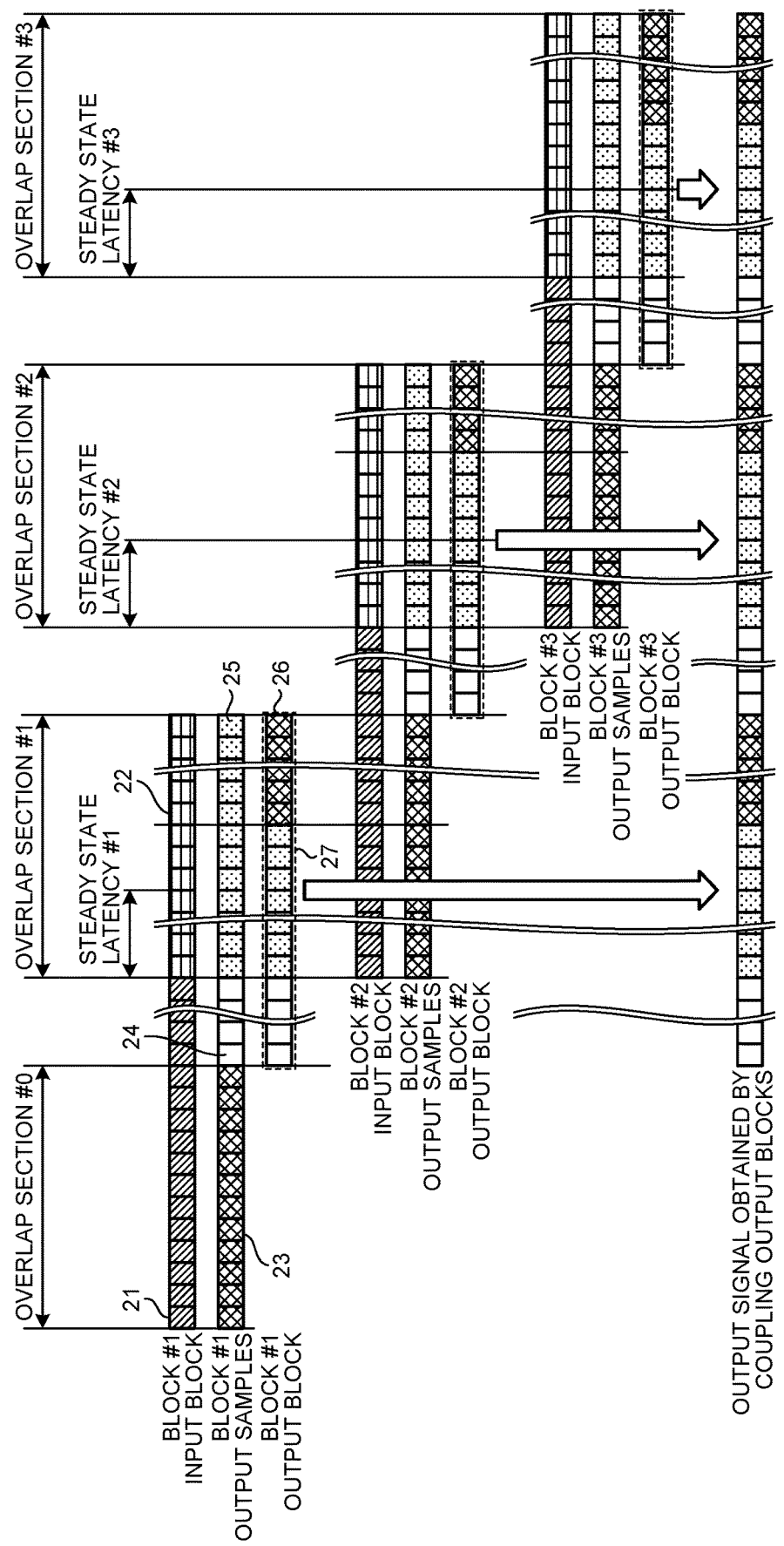
FIG. 8 is a diagram for explaining an output signal according to the first embodiment.

FIG. 8 is a diagram for explaining an output signal according to the present embodiment. FIG. 8 illustrates the coupling of the output blocks illustrated in FIG. 7 by the coupling unit 4. As illustrated in FIG. 8, the coupling unit 4 generates an output signal by coupling the output blocks of blocks #1, #2, and #3 respectively output from the signal processing units 3-2, 3-3, and 3-4 in ascending order of number, that is, in ascending order of time of the corresponding input signal.

As can be seen from FIGS. 7 and 8, the signal processing unit 3-($k$+1) according to the present embodiment filters the input block of block #k, and does not output filtered output samples in overlap section #($k$−1) that are duplicated and added to block #($k$−1). Then, after overlap section #($k$−1), the signal processing unit 3-($k$+1) according to the present embodiment outputs the output samples filtered by the signal processing unit 3-($k$+1) until the section corresponding to overlap section #k where a duplicate of the head data of block #($k$+1) is added. Further, in overlap section #k, the signal processing unit 3-($k$+1) according to the present embodiment outputs $N_{wait}$ output samples filtered by the signal processing unit 3-($k$+1). After that, once the output samples of block #k and the output samples of the overlapping section of block #(k+1) have a match of P consecutive samples, the signal processing unit 3-(k+1) outputs the output samples of the overlap section of block #(k+1). Consequently, the discontinuity between the output block of block #k and the output block of block #(k+1) can be alleviated.

In the above description, the output switching unit 364 performs both the control of output sample switching and the switching of output, but instead, a switching control unit and a switching unit may be provided separately. In this case, the switching unit outputs either the output block of block #k or the output block of block #(k+1) in accordance with an instruction from the switching control unit. The switching control unit performs S1, S3, S5, S7, and S9 illustrated in FIG. 6. In accordance with the determination results of S1, S3, S5, and S7 illustrated in FIG. 6, the switching control unit instructs the switching unit as to whether to output the output block of block #k, output the output block of block #(k+1), or output nothing.

Next, a hardware configuration of the filter circuit 1 according to the present embodiment will be described. The division unit 2, the signal processing units 3-1 to 3-m, and the coupling unit 4 of the filter circuit 1 are implemented by processing circuitry. The processing circuitry may be a memory and a processor that executes a program stored in the memory, or may be dedicated hardware. The processing circuitry is also called a control circuit.

Figure 9:
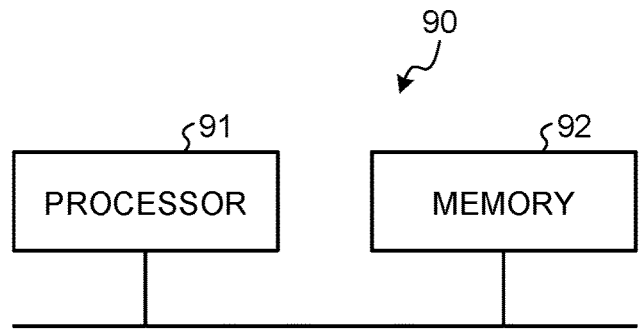
FIG. 9 is a diagram illustrating an exemplary configuration of processing circuitry that is implemented by a processor and a memory according to the first embodiment.

FIG. 9 is a diagram illustrating an exemplary configuration of processing circuitry that is implemented by a processor and a memory according to the first embodiment. The processing circuitry 90 illustrated in FIG. 9 is a control circuit and includes a processor 91 and a memory 92. In a case where the processing circuitry is configured with the processor 91 and the memory 92, each function of the processing circuitry is implemented by software, firmware, or a combination of software and firmware. Software or firmware is described as a program and stored in the memory 92. In the processing circuitry 90, the processor 91 reads and executes the program stored in the memory 92, thereby implementing each function. That is, the processing circuitry includes the memory 92 for storing the program that results in the processing of the division unit 2, the signal processing units 3-1 to 3-m, and the coupling unit 4. This program can be said to be a program for causing the filter circuit 1 to execute each function implemented by the processing circuitry, and controls the filter circuit 1. This program may be provided by a storage medium in which the program is stored, or may be provided by other means such as a communication medium.

The processor 91 is exemplified by a central processing unit (CPU), a processing device, an arithmetic device, a microprocessor, a microcomputer, or a digital signal processor (DSP). Examples of the memory 92 include a non-volatile or volatile semiconductor memory, a magnetic disk, a flexible disk, an optical disc, a compact disc, a mini disc, a digital versatile disc (DVD), and the like. Examples of non-volatile or volatile semiconductor memories include a random access memory (RAM), a read only memory (ROM), a flash memory, an erasable programmable ROM (EPROM), an electrically EPROM (EEPROM, registered trademark), and the like.

In a case where the processing circuitry is configured with dedicated hardware, the processing circuitry is exemplified by a single circuit, a composite circuit, a programmed processor, a parallel programmed processor, an application specific integrated circuit (ASIC), a field programmable gate array (FPGA), or a combination thereof. The functions of the division unit 2, the signal processing units 3-1 to 3-m, and the coupling unit 4 may be implemented by separate pieces of processing circuitry, or implemented collectively by a single piece of processing circuitry.

Note that some of the functions of the filter circuit 1 may be implemented by dedicated hardware, and the other functions may be implemented by software or firmware. In this manner, the processing circuitry can implement the above-described functions using dedicated hardware, software, firmware, or a combination thereof.

Figure 10:
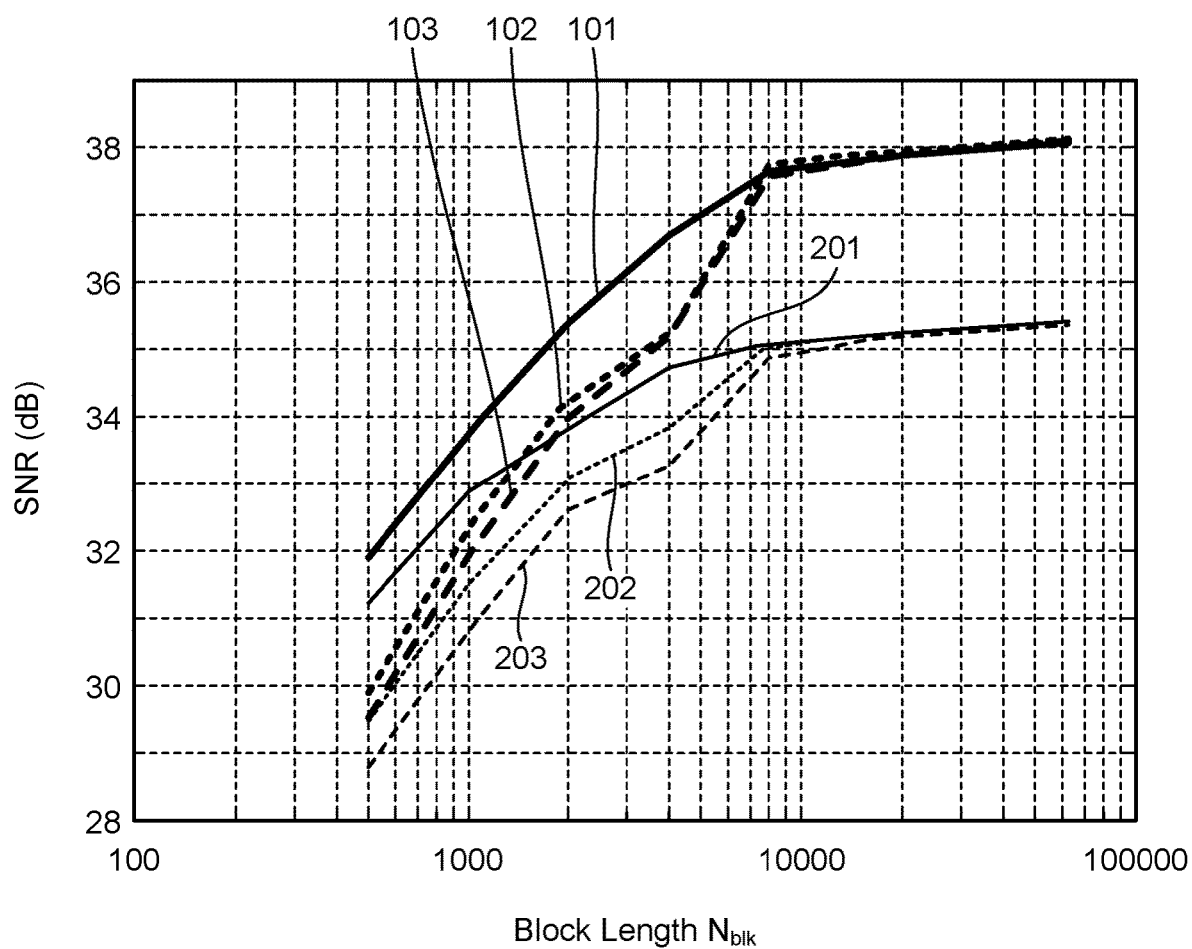
FIG. 10 is a diagram for explaining the effect of the first embodiment.

FIG. 10 is a diagram for explaining the effect of the present embodiment. The horizontal axis of FIG. 10 represents the block length $N_{blk}$, and the vertical axis of FIG. 10 represents the signal-to-noise ratio (SNR). SNRs 101 and 201 each indicate the SNR of output signals relative to different block lengths in the case of using the filter circuit 1 according to the present embodiment. SNR 101 represents the case of $N_{order}=5$ and $N_{overlap}=40$, and SNR 201 represents the case of $N_{order}=4$ and $N_{overlap}=40$. $N_{order}$ is the filter order (number of taps) in the filter circuit 1. SNRs 102, 103, 202, and 203 indicate the SNR of output signals relative to different block lengths in a comparative example. The comparative example is based on a method in which an input signal is simply divided for parallelized filtering. SNR 102 represents the case of $N_{order}=5$ and $N_{overlap}=40$ in the comparative example, and SNR 103 represents the case of $N_{order}=5$ and $N_{overlap}=1$ in the comparative example. SNR 202 represents the case of $N_{order}=4$ and $N_{overlap}=40$ in the comparative example, and SNR 203 represents the case of $N_{order}=4$ and $N_{overlap}=1$.

As illustrated in FIG. 10, SNRs 101 and 201 obtained by using the filter circuit 1 according to the present embodiment are higher than those of the comparative example in the region where the block length $N_{blk}$ is short. In the example illustrated in FIG. 10, the use of the filter circuit 1 according to the present embodiment results in a signal-to-noise ratio improvement of about 1.2 to 1.5 dB compared with the comparative example in the region where the block length is not greater than several thousand samples.

According to the present embodiment, when an input signal is time-divided into blocks and the time-division blocks are filtered in parallel by individual signal processing units, it is possible to alleviate the discontinuity of the output signal at the boundary between blocks, and to improve the signal-to-noise ratio. Moreover, in the present embodiment, it is possible to reduce memory usage as compared with the case of not applying the present embodiment because it is possible to obtain an equivalent level of signal-to-noise ratio by setting a smaller block length.

Second Embodiment

Figure 11:
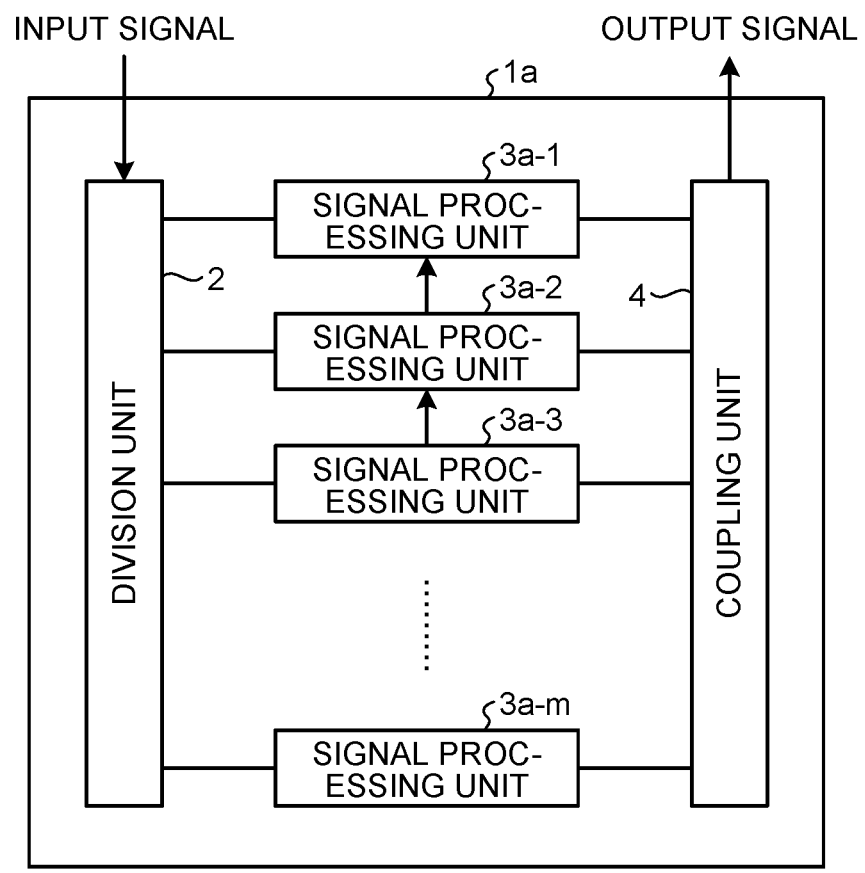
FIG. 11 is a diagram illustrating an exemplary configuration of a filter circuit according to a second embodiment.

FIG. 11 is a diagram illustrating an exemplary configuration of a filter circuit according to the second embodiment. As illustrated in FIG. 11, the filter circuit 1a according to the present embodiment is the same as the filter circuit 1 according to the first embodiment except that signal processing units 3a-1 to 3a-m are provided instead of the signal processing units 3-1 to 3-m. Components having the same functions as those in the first embodiment are hereinafter denoted by the same reference signs as those in the first embodiment, and redundant explanations are omitted. Differences from the first embodiment will be mainly described hereinafter.

Figure 12:
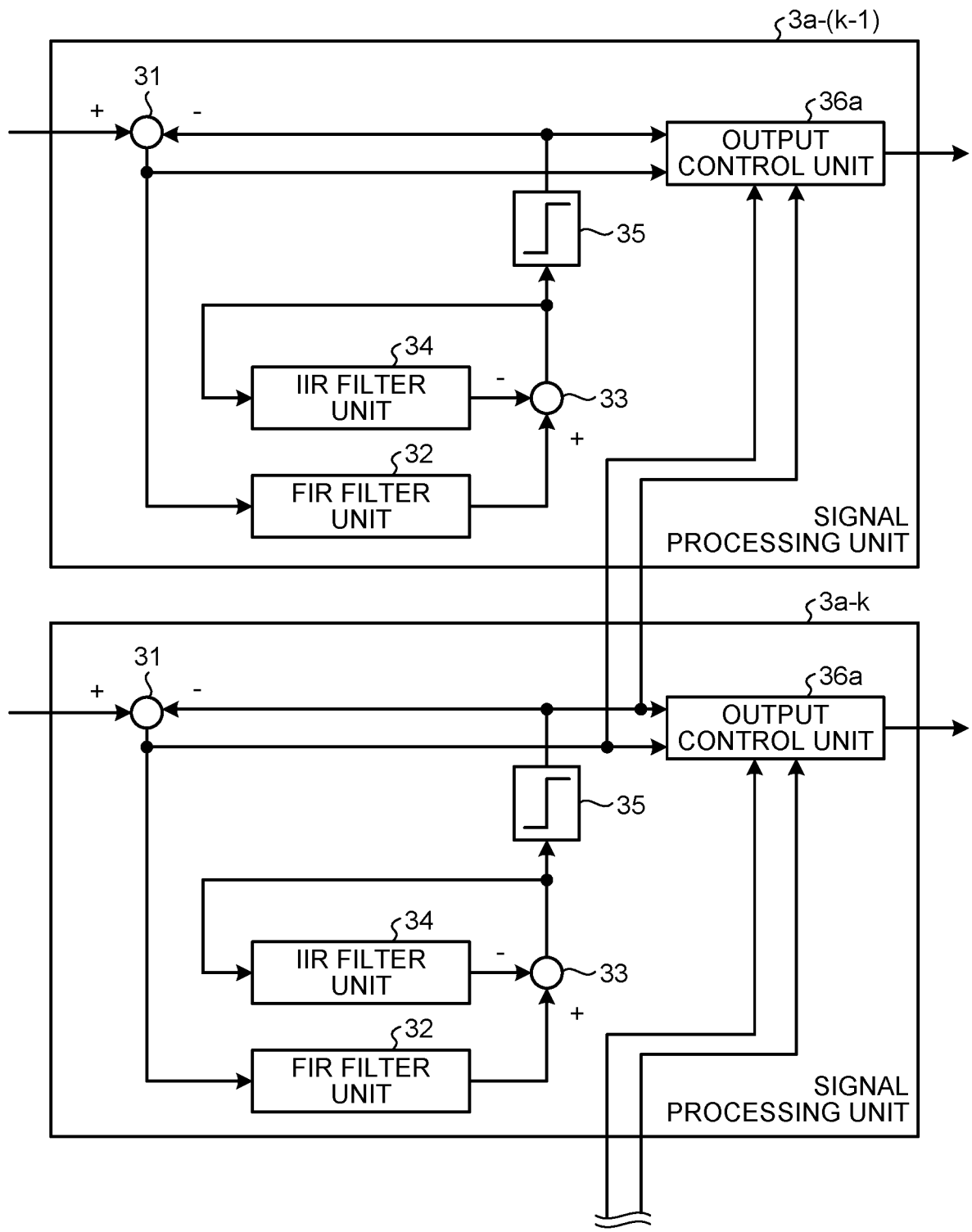
FIG. 12 is a diagram illustrating an exemplary configuration of a signal processing unit according to the second embodiment.

FIG. 12 is a diagram illustrating an exemplary configuration of the signal processing unit 3a-(k−1) and the signal processing unit 3a-k according to the present embodiment. As illustrated in FIG. 12, the signal processing unit 3a-(k−1) is the same as the signal processing unit 3-(k−1) according to the first embodiment except that an output control unit 36a is provided instead of the output control unit 36 according to the first embodiment, and that the signal output from the subtraction unit 31, that is, the signal about to be input to the FIR filter unit 32, is input to the output control unit 36a and the signal processing unit 3a-(k−2) (not illustrated). The configuration of the signal processing unit 3a-k is the same as that of the signal processing unit 3a-(k−1).

Figure 13:
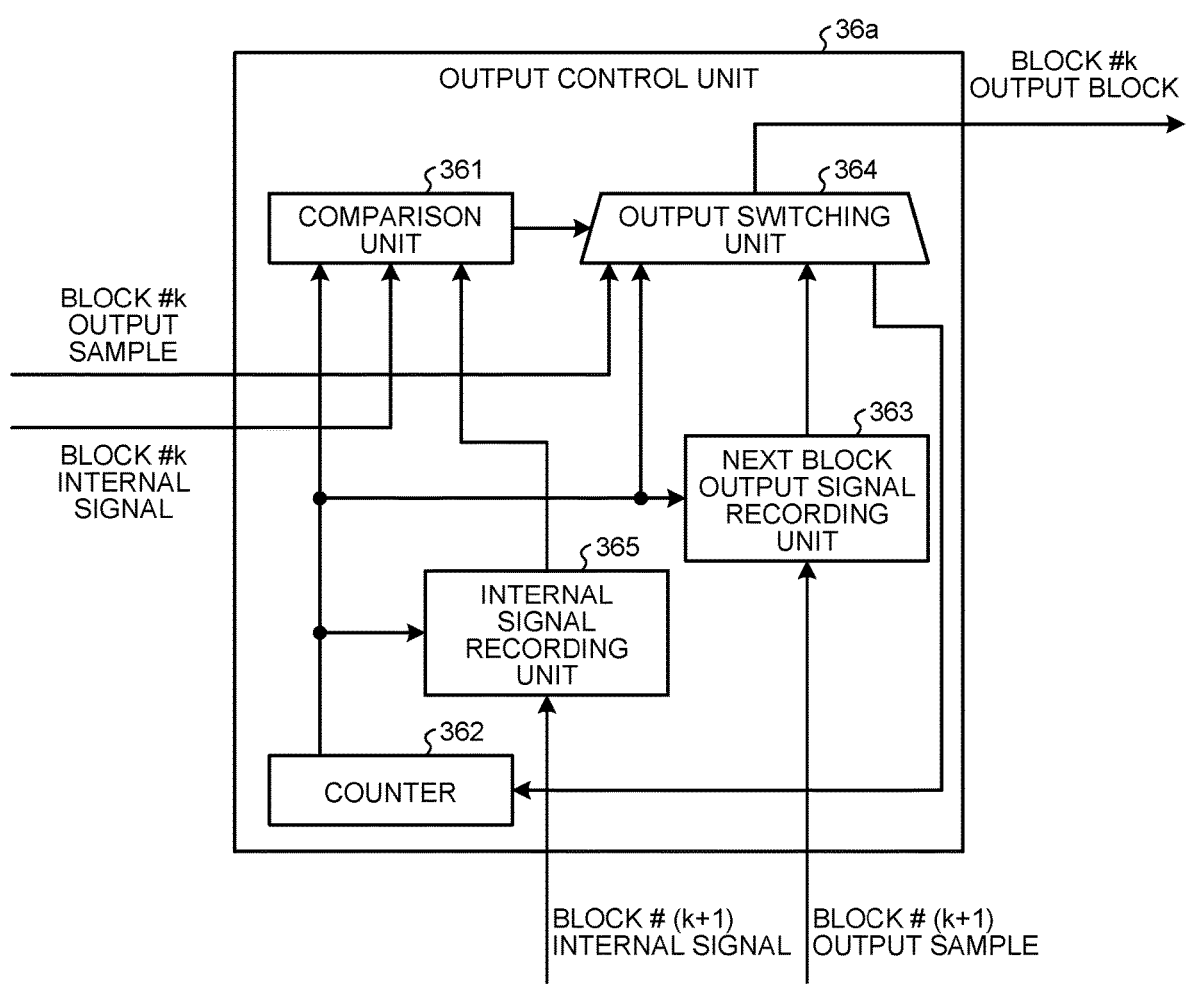
FIG. 13 is a diagram illustrating an exemplary configuration of an output control unit according to the second embodiment.

FIG. 13 is a diagram illustrating an exemplary configuration of the output control unit 36a according to the present embodiment. As illustrated in FIG. 13, the output control unit 36a according to the present embodiment includes the comparison unit 361, the counter 362, the next block output signal recording unit 363, the output switching unit 364, and an internal signal recording unit 365. The output control unit 36a includes the internal signal recording unit 365 in addition to the components of the output control unit 36 according to the first embodiment. The counter value of the counter 362 is also input to the internal signal recording unit 365, and the comparison unit 361 receives internal signals, i.e., the signal output from the internal signal recording unit 365, and the signal output from the subtraction unit 31.

The internal signal recording unit 365 of the signal processing unit 3a-(k−1) records the samples corresponding to the head data among the internal signal input from the signal processing unit 3a-k. The internal signal recording unit 365 outputs a sample of the recorded internal signal samples of block #(k+1) to the comparison unit 361 on the basis of the counter value input from the counter 362. The comparison unit 361 compares two different input samples and outputs the comparison result in the same manner as the comparison unit 361 according to the first embodiment, but as described above, the input samples are different from those in the first embodiment. The comparison unit 361 compares the internal signal sample output from the subtraction unit 31 with the internal signal sample generated in the processing of the next block, and outputs the comparison result to the output switching unit 364.

The output switching unit 364 switches output on the basis of the counter value of the counter 362 and the comparison result from the comparison unit 361 in the same manner as in the first embodiment in accordance with the procedure illustrated in FIG. 6. Because the internal signals according to the present embodiment are influenced by the processing results in the non-linear processing unit 35, it is possible to alleviate the discontinuity between blocks by using the comparison result between these internal signals and switching output at the timing of a match of P consecutive samples between these two different internal signals. Except for the above-described differences, the operation of the output control unit 36a is the same as that of the output control unit 36 according to the first embodiment. The hardware configuration of the filter circuit 1a is also the same as that of the filter circuit 1.

Specifically, the present embodiment is the same as the first embodiment in that the switching timing is a timing within a period during which first output samples corresponding to the duplicated data is generated, that is, a period corresponding to the overlap section. The switching timing of the present embodiment is the timing at which the difference between a first signal generated by the signal processing unit that has generated first output samples and a second signal generated by the signal processing unit that has generated second output samples is less than or equal to a threshold consecutively for the second data length. However, in the present embodiment, the first signal is a signal subjected to part of the filtering in the signal processing unit that generates the first output samples, and the second signal is a signal subjected to part of the filtering in the signal processing unit that generates the second output samples.

In the present embodiment, output is switched on the basis of the comparison result between the internal signal of block #k and the internal signal of block #(k+1), instead of that between output samples in the first embodiment. The use of internal signals instead of output samples can achieve the same effect as in the first embodiment. Depending on the filtering performed by the filter circuit 1a, the use of internal signals may be more effective for discontinuity improvement than the first embodiment. This is because the frequency component of the signals to be compared by the comparison unit 361 can be limited by using internal signals.

Figure 14:
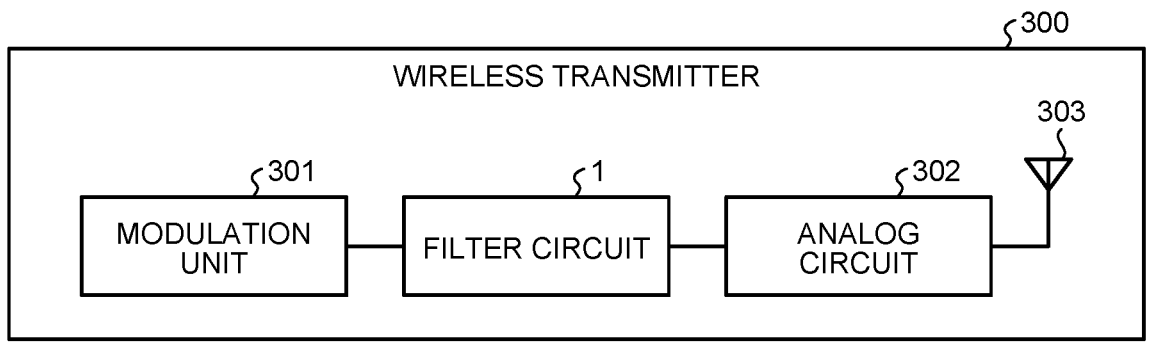
FIG. 14 is a diagram illustrating an exemplary configuration of a wireless transmitter including the filter circuit according to the first embodiment.

Next, examples of application of the filter circuits described in the first embodiment and the second embodiment will be described. FIG. 14 is a diagram illustrating an exemplary configuration of a wireless transmitter including the filter circuit 1. As illustrated in FIG. 14, the wireless transmitter 300 includes a modulation unit 301, the filter circuit 1, an analog circuit 302, and an antenna 303. That is, the wireless transmitter 300 includes the division unit 2, the plurality of signal processing units 3, and the coupling unit 4, and transmits the output blocks coupled by the coupling unit 4. The wireless transmitter 300 is installed in an artificial satellite, for example. The modulation unit 301 generates a modulated signal by digitally modulating the data to be transmitted. The data to be transmitted may be any data, e.g. observation data for the wireless transmitter 300 which is installed in an observation satellite. The filter circuit 1 converts the modulated signal generated by the modulation unit 301 into an analog signal, and outputs the analog signal to the analog circuit 302. The analog circuit 302 performs processing on the analog signal, such as amplification and removal of unnecessary frequency components through an analog filter. The signal processed by the analog circuit 302 is transmitted as radio waves via the antenna 303. In a case where the filter circuit 1 is implemented by the above-described control circuit, namely the processing circuitry 90, this control circuit causes the wireless transmitter 300 to execute the processing of the filter circuit 1 described above. Although FIG. 14 depicts the wireless transmitter 300 including the filter circuit 1 according to the first embodiment, the wireless transmitter 300 may include the filter circuit 1a described in the second embodiment instead of the filter circuit 1.

Figure 15:
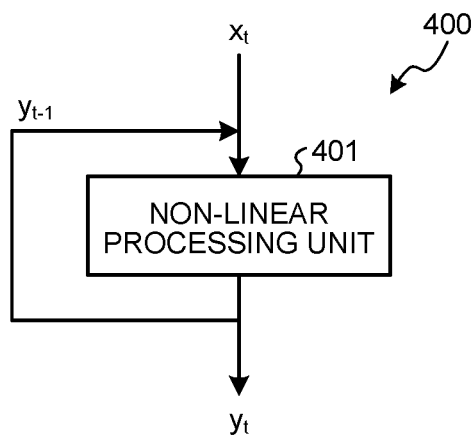
FIG. 15 is a diagram illustrating an example of a feedback circuit in an RNN.

In addition, the filter circuits described in the first embodiment and the second embodiment may be used as a feedback circuit including non-linear processing in a recurrent neural network (RNN). In the RNN, feedback processing is used in the intermediate layer. FIG. 15 is a diagram illustrating an example of a feedback circuit 400 in the RNN. The feedback circuit 400 includes a non-linear processing unit 401 that performs non-linear processing. The non-linear processing unit 401 uses the input signal $x_t$ corresponding to time t and the output signal $y_{t−1}$ at time (t−1) from the non-linear processing unit 401 to perform non-linear processing, and generates the output signal $y_t$, where "t" represents discrete time. In the circuit including such non-linear processing, parallelization is performed in the same manner as in the signal processing units 3 according to the first embodiment, whereby the processing can be parallelized and the discontinuity of the input signal can be reduced. Specifically, for example, a plurality of feedback circuits 400 illustrated in FIG. 15 are provided, the output control unit 36 is provided on the subsequent stage of each feedback circuit 400, and the output signal from the k-th feedback circuit 400 is input to the (k−1)-th output control unit. Then, as in the exemplary configuration of FIG. 1, the division unit 2 and the coupling unit 4 are provided respectively on the preceding stage and the subsequent stage of a plurality of signal processing units, where one signal processing unit is one set of the feedback circuit 400 and the output control unit 36. The configurations and methods of signal processing parallelization described in the first and second embodiments are not limited to the examples of application described above, and can be applied to any circuit including some signal processing to be parallelized.

The filter circuit according to the disclosure can achieve the effect of alleviating the discontinuity of a filtered signal at the boundary between blocks.

The configurations described in the above-mentioned embodiments indicate examples of the contents of the disclosure. The configurations can be combined with another well-known technique, and some of the configurations can be omitted or changed in a range not departing from the gist.

What is claimed is:

1. A filter circuit comprising:
a division unit to: divide an input signal into division blocks having data lengths defined by time domain, the division blocks including a first division block and a second division block next to and temporally continuous with the first division block; and duplicate head data of the second division block and add duplicated data to a tail end of the first division block to thereby generate an input block, the duplicated data being the duplicated head data, the head data being data of a head of the second division block and having a first data length;
a plurality of signal processing units to each perform filtering of a feedback type on a corresponding one of a plurality of the input blocks on a sample-by-sample basis to generate output samples as a result of the filtering, and generate and output an output block, using the output samples; and
a coupling unit to couple the output blocks output from the plurality of signal processing units, wherein
in response to each input block, at least one of the plurality of signal processing units outputs first output samples as the output block until a switching timing, the first output samples being the output samples generated by the at least one of the plurality of signal processing units, and outputs a part of second output samples as the output block after the switching timing, the second output samples being the output samples generated by the signal processing unit that processes the next input block, the output part of the second output samples corresponding to a part that follows the first output samples already output as the output block, and
the switching timing is a timing within a period during which the first output samples corresponding to the duplicated data are generated, at which timing a difference between a first signal generated by the signal processing unit that has generated the first output samples and a second signal generated by the signal processing unit that has generated the second output samples is less than or equal to a threshold consecutively for a second data length.

2. The filter circuit according to claim 1, wherein, when at least one of the plurality of signal processing units processes the input block that is a first input block, and discards the first output samples corresponding to the head data of the first input block, provided that there exists the signal processing unit that processes a second input block that is the input block having duplicated data added thereto, the duplicated data being duplicated head data of the first input block.

3. The filter circuit according to claim 1, wherein the filtering includes non-linear processing.

4. The filter circuit according to claim 3, wherein the non-linear processing is quantization for outputting a discrete value by comparing a predetermined determination threshold with an input signal.

5. The filter circuit according to claim 1, wherein the switching timing is a timing within a period during which the first output samples corresponding to the duplicated data except for a third data length from the head of the first output samples are generated, at which timing the difference between the first signal generated by the signal processing unit that has generated the first output samples and the second signal generated by the signal processing unit that has generated the second output samples is less than or equal to the threshold consecutively for the second data length.

6. The filter circuit according to claim 1, wherein the first signal is the first output samples, and the second signal is the second output samples.

7. The filter circuit according to claim 1 wherein the first signal is a signal subjected to part of the filtering in the signal processing unit that generates the first output samples, and the second signal is a signal subjected to part of the filtering in the signal processing unit that generates the second output samples.

8. A signal processing method for a filter circuit, the filter circuit including: a division unit to: divide an input signal into division blocks having data lengths defined by time domain, the division blocks including a first division block and a second division block next to and temporally continuous with the first division block; and duplicate head data of the second division block and add duplicated data to a tail end of the first division block to thereby generate an input block, the duplicated data being the duplicated head data, the head data being data of a head of the second division block and having a first data length; a plurality of signal processing units to each perform filtering on a corresponding one of a plurality of the input blocks on a sample-by-sample basis to generate output samples as a result of the filtering, and generate and output an output block, using the output samples; and a coupling unit to couple the output blocks output from the plurality of signal processing units, the signal processing method comprising:
outputting first output samples as the output block until a switching timing, the first output samples being the output samples generated by at least one of the plurality of signal processing units;
identifying, as the switching timing, a timing within a period during which the first output samples corresponding to the duplicated data are generated, at which timing a difference between a first signal generated by the signal processing unit that has generated the first output samples and a second signal generated by the signal processing unit that has generated second output samples is less than or equal to a threshold consecutively for a second data length, the second output samples being the output samples generated by the signal processing unit that processes the next input block; and outputting a part of the second output samples as the output block after the switching timing, the output part of the second output samples corresponding to a part that follows the first output samples already output as the output block.

9. A control circuit in a wireless transmitter, the wireless transmitter including: a division unit to: divide an input signal into division blocks having data lengths defined by time domain, the division blocks including a first division block and a second division block next to and temporally continuous with the first division block; and duplicate head data of the second division block and add duplicated data to a tail end of the first division block to thereby generate an input block, the duplicated data being the duplicated head data, the head data being data of a head of the second division block and having a first data length; a plurality of signal processing units to each perform filtering on a corresponding one of a plurality of the input blocks on a sample-by-sample basis to generate output samples as a result of the filtering, and generate and output an output block, using the output samples; and a coupling unit to couple the output blocks output from the plurality of signal processing units, the wireless transmitter transmitting the output blocks coupled by the coupling unit, the control circuit causing the wireless transmitter to execute:

in response to each input block, outputting first output samples as the output block until a switching timing, the first output samples being the output samples generated by at least one of the plurality of signal processing units;

identifying, as the switching timing, a timing within a period during which the first output samples corresponding to the duplicated data are generated, at which timing a difference between a first signal generated by the signal processing unit that has generated the first output samples and a second signal generated by the signal processing unit that has generated second output samples is less than or equal to a threshold consecutively for a second data length, the second output samples being the output samples generated by the signal processing unit that processes the next input block; and outputting a part of the second output samples as the output block after the switching timing, the output part of the second output samples corresponding to a part that follows the first output samples already output as the output block.

10. A non-transitory storage medium storing a program for controlling a filter circuit, the filter circuit including: a division unit to: divide an input signal into division blocks having data lengths defined by time domain, the division blocks including a first division block and a second division block next to and temporally continuous with the first division block; and duplicate head data of the second division block and add duplicated data to a tail end of the first division block to thereby generate an input block, the duplicated data being the duplicated head data, the head data being data of a head of the second division block and having a first data length; a plurality of signal processing units to each perform filtering on a corresponding one of a plurality of the input blocks on a sample-by-sample basis to generate output samples as a result of the filtering, and generate and output an output block, using the output samples; and a coupling unit to couple the output blocks output from the plurality of signal processing units, the program causing the filter circuit to execute:

outputting first output samples as the output block until a switching timing, the first output samples being the output samples generated by at least one of the plurality of signal processing units;

identifying, as the switching timing, a timing within a period during which the first output samples corresponding to the duplicated data are generated, at which timing a difference between a first signal generated by the signal processing unit that has generated the first output samples and a second signal generated by the signal processing unit that has generated second output samples is less than or equal to a threshold consecutively for a second data length, the second output samples being the output samples generated by the signal processing unit that processes the next input block; and outputting a part of the second output samples as the output block after the switching timing, the output part of the second output samples corresponding to a part that follows the first output samples already output as the output block.

* * * * *